(12) United States Patent
Lee et al.

(10) Patent No.: US 12,500,104 B2
(45) Date of Patent: Dec. 16, 2025

(54) FLOW SUPPLY APPARATUS AND SUPPLY METHOD

(71) Applicant: SEMES CO., LTD., Chungcheongnam-do (KR)

(72) Inventors: Sung Ho Lee, Chungcheongnam-do (KR); No Jae Park, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 459 days.

(21) Appl. No.: 18/083,179

(22) Filed: Dec. 16, 2022

(65) Prior Publication Data

US 2023/0207361 A1 Jun. 29, 2023

(30) Foreign Application Priority Data

Dec. 29, 2021 (KR) .................. 10-2021-0191747

(51) Int. Cl.
*H01L 21/673* (2006.01)
*H01L 21/677* (2006.01)

(52) U.S. Cl.
CPC .. *H01L 21/67393* (2013.01); *H01L 21/67769* (2013.01); *H01L 21/67775* (2013.01)

(58) Field of Classification Search
CPC ......... H01L 21/67733; H01L 21/67775; H01L 21/67769; H01L 21/67389; H01L 21/67017; H01L 21/67393; H01L 21/6773
See application file for complete search history.

(56) References Cited

U.S. PATENT DOCUMENTS

| | | | | |
|---|---|---|---|---|
| 5,332,013 A * | 7/1994 | Sugita | ............... | H01L 21/67724 141/351 |
| 6,135,168 A * | 10/2000 | Yang | ................. | H01L 21/67393 414/217 |
| 6,637,998 B2 * | 10/2003 | Langan | ............. | H01L 21/67724 414/217 |
| 10,056,281 B2 * | 8/2018 | Ogawa | ............. | H01L 21/67393 |
| 10,325,797 B2 * | 6/2019 | Iwasaki | ............. | H01L 21/67389 |
| 10,502,605 B2 | 12/2019 | Ueda et al. | | |

(Continued)

FOREIGN PATENT DOCUMENTS

| | | |
|---|---|---|
| KR | 10-2016-0109372 | 9/2016 |
| KR | 10-1674454 | 11/2016 |
| KR | 10-2017-0057848 | 5/2017 |

(Continued)

OTHER PUBLICATIONS

Office Action dated Jul. 7, 2023 for Korean Patent Application No. 10-2021-0191747 and its English translation from Global Dossier.

(Continued)

*Primary Examiner* — Glenn F Myers
(74) *Attorney, Agent, or Firm* — WOMBLE BOND DICKINSON (US) LLP

(57) ABSTRACT

Provided are a flow supply apparatus and supply method. The flow supply apparatus, comprising: a rail; a transport unit disposed on the rail, where an object is loaded; and a gas treatment unit provided on the transport unit and configured to purge the object. The object includes a FOUP with a substrate accommodated therein, and fume is removed from the substrate through the purging.

15 Claims, 8 Drawing Sheets

(56) References Cited

U.S. PATENT DOCUMENTS 11,501,991 B2    11/2022   Tsubaki et al.
11,597,607 B2     3/2023   Oh et al.

FOREIGN PATENT DOCUMENTS

KR    10-2018-0092288     8/2018
KR    10-2021-0016607     2/2021
KR       10-2256132       5/2021
WO       2017/212841     12/2017

OTHER PUBLICATIONS

Notice of Allowance dated Oct. 11, 2023 for Korean Patent Application No. 10-2021-0191747 and its English translation from Global Dossier.

* cited by examiner

[FIG. 1]
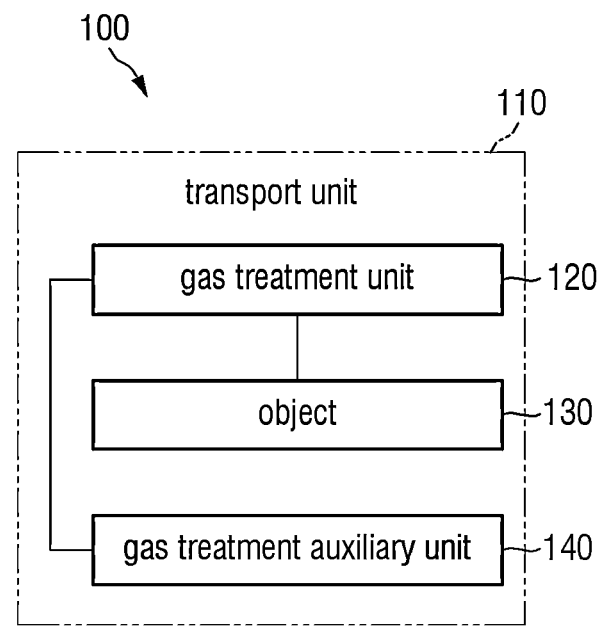

[FIG. 2]
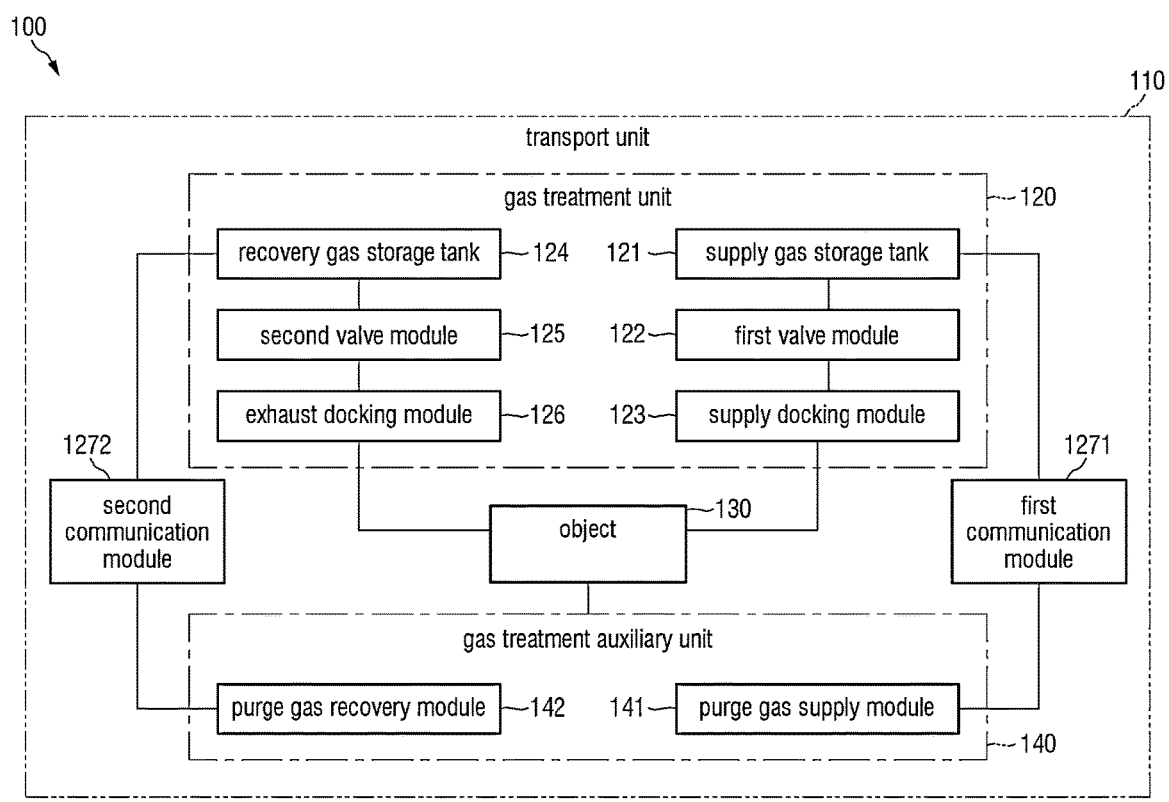

[FIG. 3]
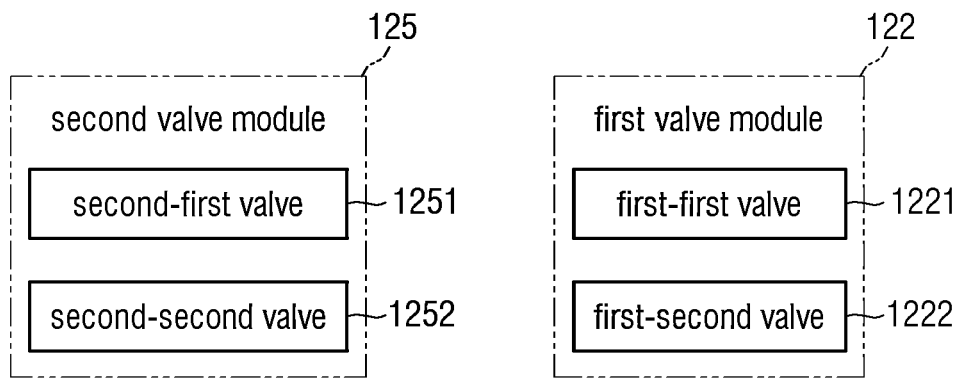
[FIG. 4]
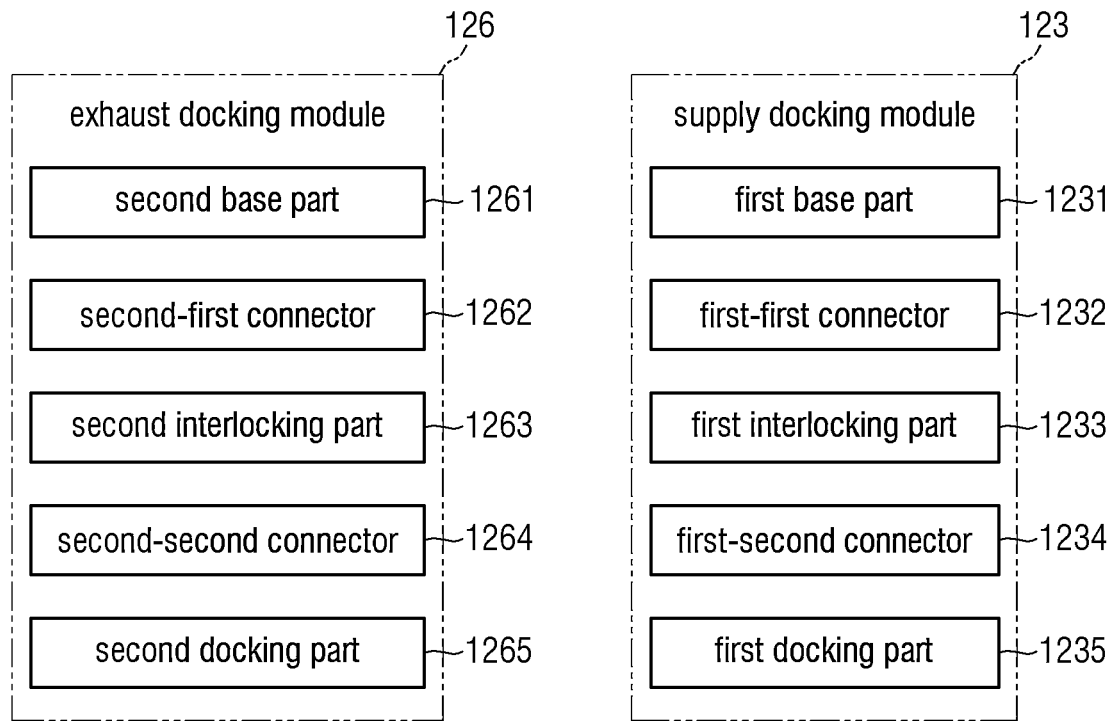

[FIG. 5]
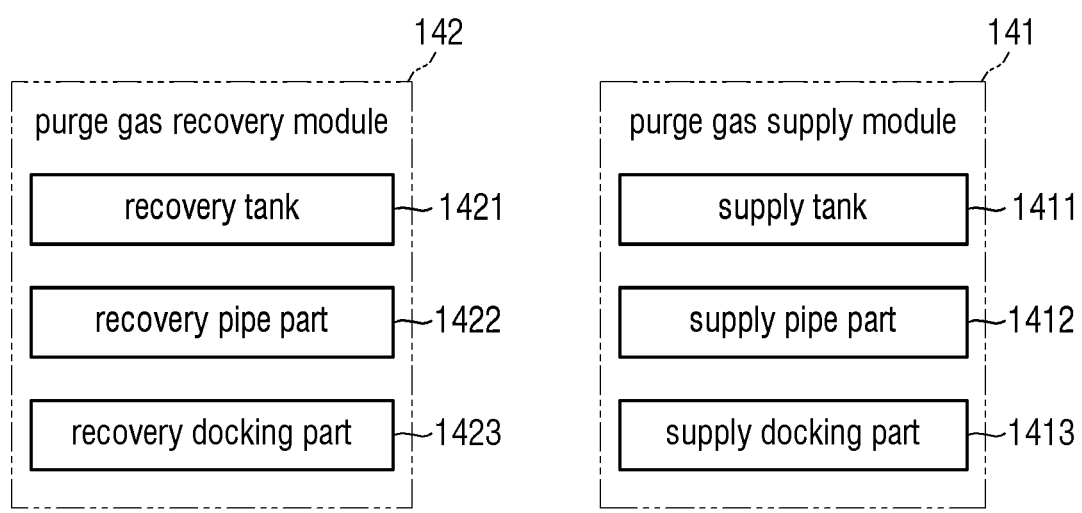

[FIG. 6]
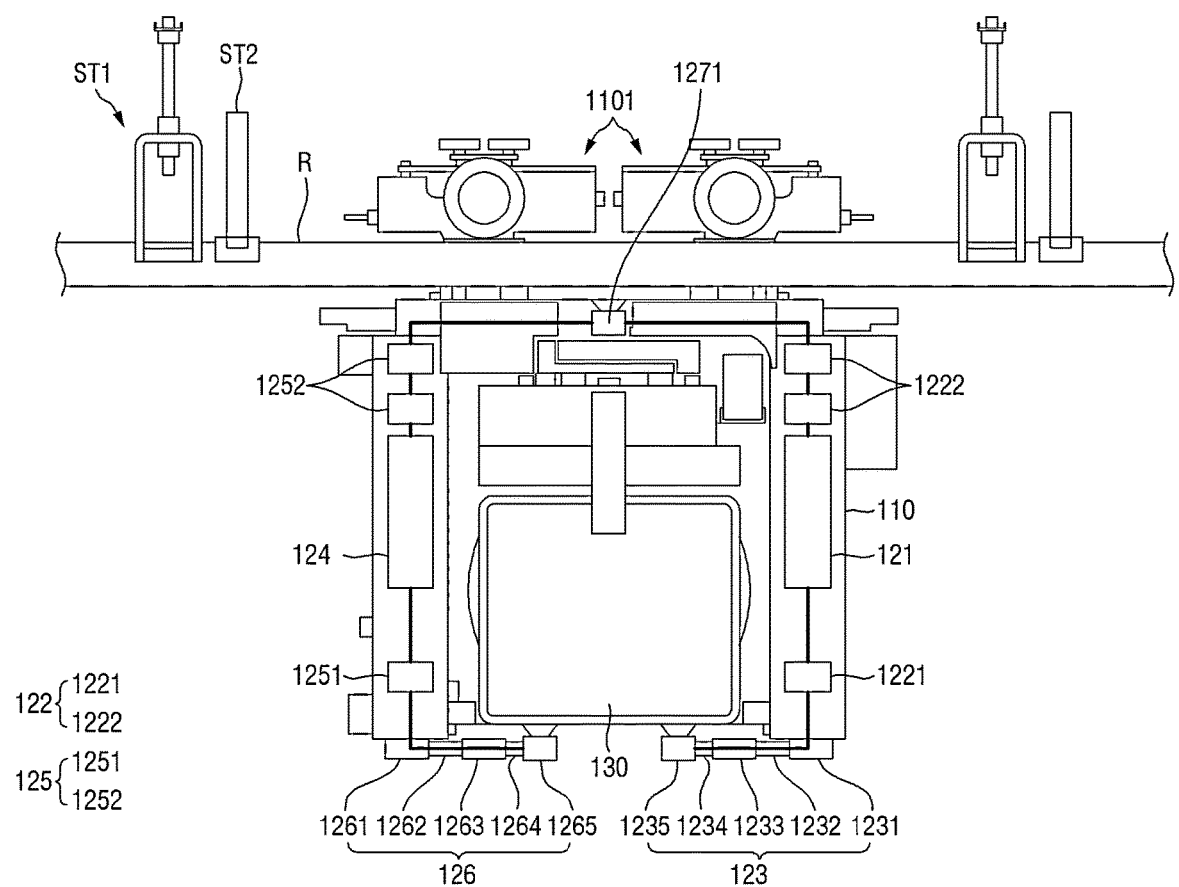

[FIG. 7]
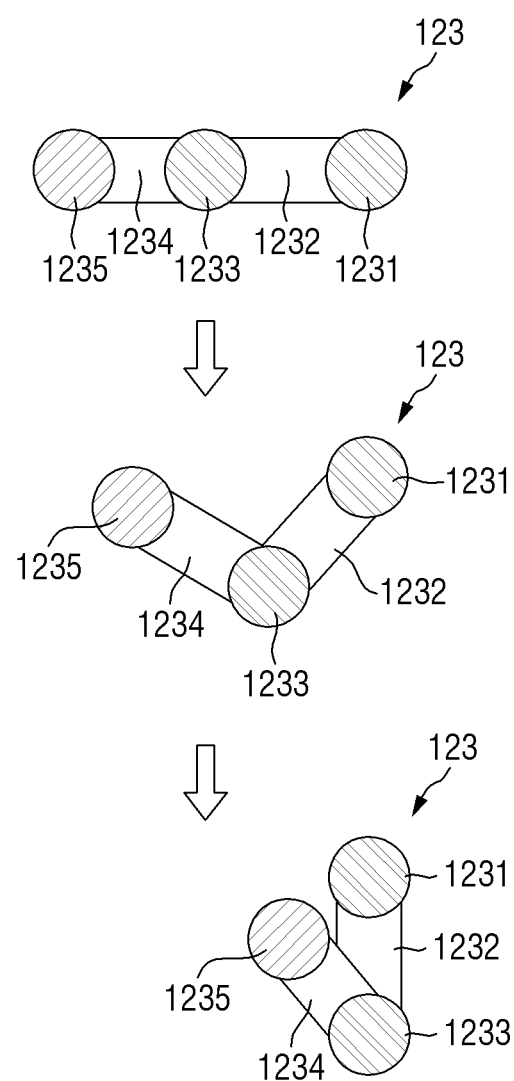

[FIG. 8]
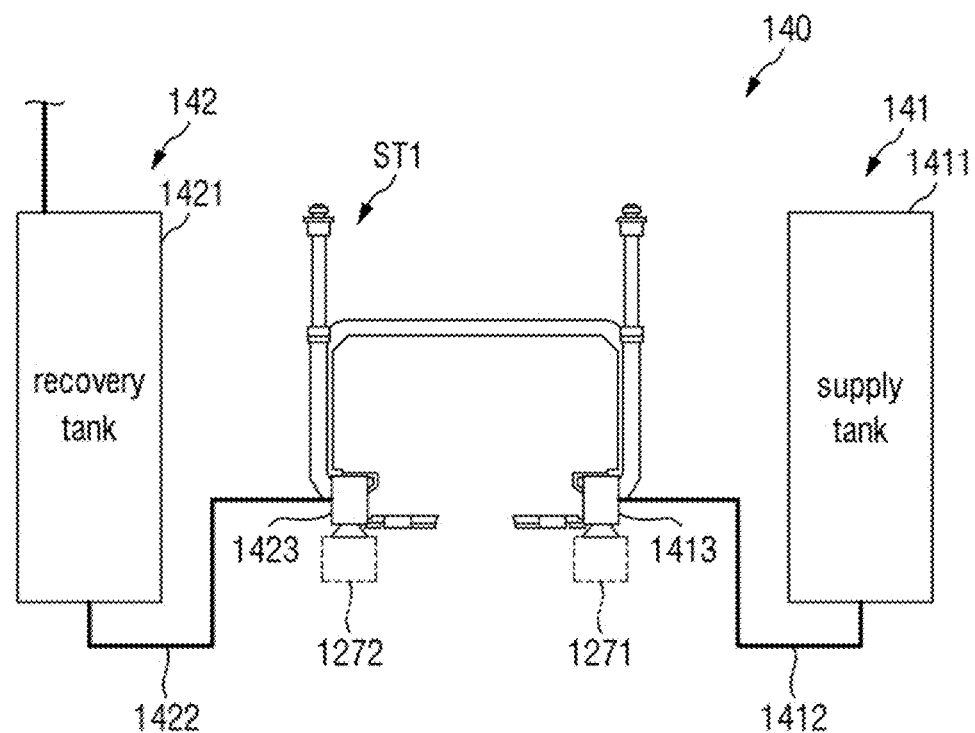
[FIG. 9]
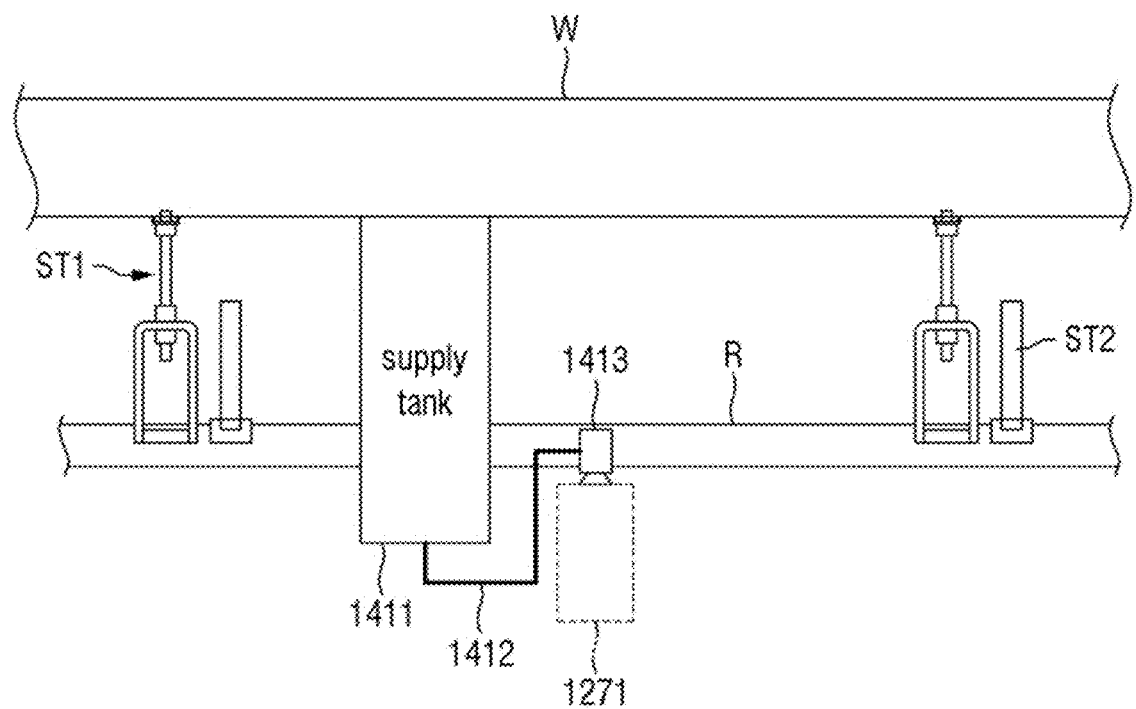

[FIG. 10]
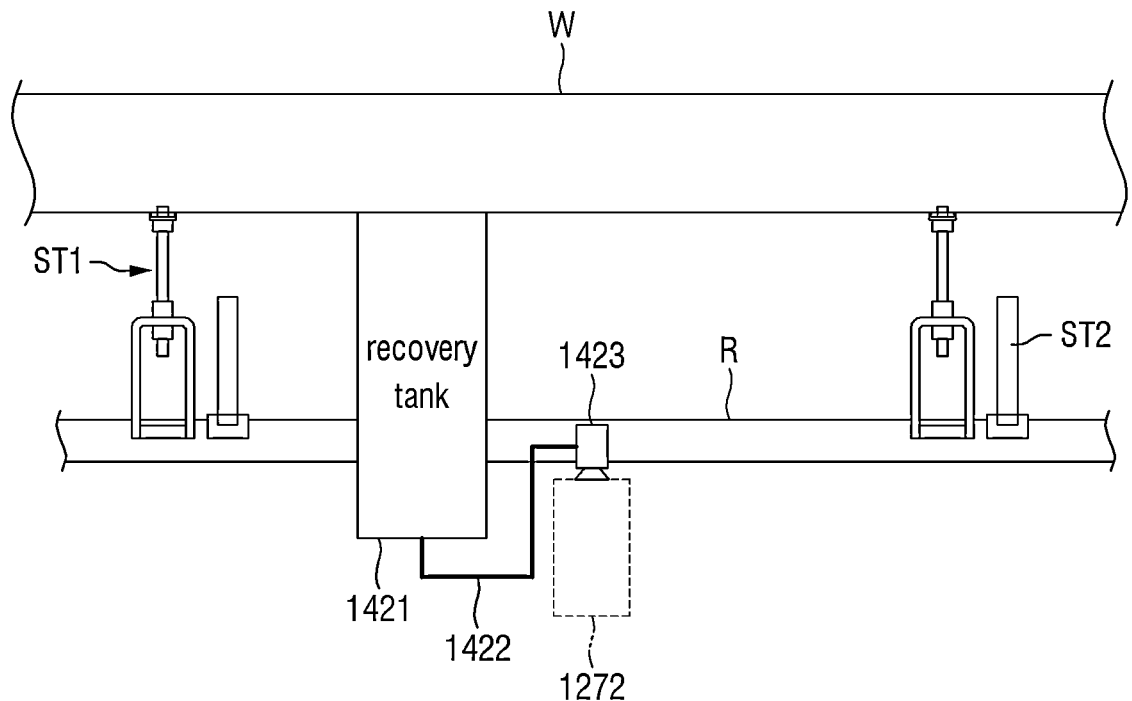
[FIG. 11]
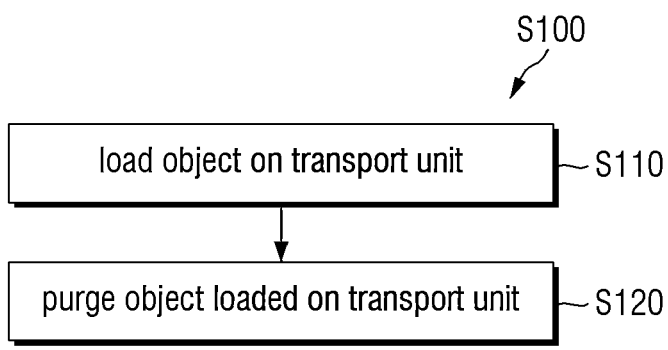

FLOW SUPPLY APPARATUS AND SUPPLY METHOD

CROSS-REFERENCE TO RELATED APPLICATION

This application claims priority from Korean Patent Application No. 10-2021-0191747 filed on Dec. 29, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a flow supply apparatus and supply method.

2. Description of the Related Art

In a front opening unified pod (FOUP), a container used in semiconductor logistics, a process of supplying a nitrogen flow may be performed. For instance, when suppling nitrogen in the semiconductor logistics, nitrogen is supplied only from container storage devices (e.g., a stocker, a STB, etc.). However, during the logistics movement process, the flow supply needs to be performed in a more diverse way.

CONVENTIONAL ART DOCUMENT

Patent Document (Patent Document 0001) Korean Unexamined Patent Application Publication No. 10-2016-0109372

SUMMARY

Aspects of the present disclosure provide an operation of more quickly and efficiently supplying a nitrogen flow to a FOUP as a container in semiconductor logistics running.

Specifically, in addition to the purpose of a container transfer, the efficiency with the rapidity of the process needs to be increased by complexly performing a flow supply.

In addition, proposing and implementing specific measures to perform a flow supply in various ways at a logistics site are needed.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a flow supply method, comprising: loading an object on a transport unit on a rail; and purging the inside of the object by injecting a purge gas into the loaded object by a gas treatment unit provided in the transport unit. The object may include a FOUP with a substrate accommodated therein, and fume is removed from the substrate through the purging.

According to another aspect of the present disclosure, there is provided a flow supply apparatus, comprising: a rail; a transport unit disposed on the rail, where an object is loaded; and a gas treatment unit provided on the transport unit and configured to purge the object. The object includes a FOUP with a substrate accommodated therein, and fume is removed from the substrate through the purging.

According to another aspect of the present disclosure, there is provided a flow supply apparatus, comprising: a rail; a transport unit disposed on the rail, where an object is loaded; a gas treatment unit provided on the transport unit and configured to purge the object; and a gas treatment auxiliary unit docked with the gas treatment unit to assist in treating a purge gas. The object includes a FOUP with a substrate accommodated therein, and fume is removed from the substrate through the purging. The gas treatment unit comprises: a supply gas storage tank provided on the transport unit and configured to store the purge gas for the purging; a recovery gas storage tank provided on the transport unit and configured to recover the purge gas from the purged object; a supply docking module docked on the object and configured to supply the purge gas; and an exhaust docking module docked on the object and configured to exhaust the purge gas from the inside of the object. The supply docking module comprises: a first base part provided on the transport unit; a first interlocking part connected to the first base part through a first-first connector; and a first docking part installed with the first base part on a first connection part through a first-second connector and docked on the object. The first docking part rotates from the first base part in a set range through the first interlocking part and is rotatably provided on at least an area facing the object, and the first docking part supplies the purge gas to the object based on contact at least on a bottom surface of the object. The gas treatment auxiliary unit comprises: a purge gas supply module disposed on the rail or the transport unit and configured to supply the purge gas to the supply gas storage tank; and a purge gas recovery module disposed on the rail or the transport unit and configured to recover the purge gas from the recovery gas storage tank.

Advantageous Effects

In accordance with the flow supply apparatus and supply method of the present disclosure described above, there are one or more of the following effects.

The present disclosure enables a more quick and efficient supply of a nitrogen flow to the FOUP as a container in semiconductor logistics running.

Specifically, in addition to the purpose of a container transfer, the efficiency with the rapidity of the process can be increased by complexly performing a flow supply.

It is also possible to propose and implement specific measures to perform a flow supply in various ways at a logistics site.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a block diagram illustrating components of a flow supply apparatus according to one embodiment of the present disclosure;

FIGS. 2 to 5 are block diagrams illustrating the components of FIG. 1;

FIGS. 6 to 10 are views illustrating the components of FIG. 1; and

FIG. 11 is a flowchart sequentially illustrating a flow supply method according to one embodiment of the present disclosure.

DETAILED DESCRIPTION OF THE EMBODIMENT

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above" and "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

The terminology used herein is for the purpose of describing particular embodiments only and is not intended to be limiting of the disclosure. In this specification, the singular also includes the plural unless specifically stated otherwise in the phrase. As used herein, "comprises" and/or "comprising" refers to the presence of one or more other components, steps, operations and/or elements. Or does not exclude additions.

Unless otherwise defined, all terms (including technical and scientific terms) used in the present specification may be used in a sense that can be commonly understood by those skilled in the art. In addition, the terms defined in the commonly used dictionaries are not ideally or excessively interpreted unless they are specifically defined clearly.

Hereinafter, embodiments of the present disclosure will be described with reference to the attached drawings. The same or similar elements are assigned the same reference numerals irrespective of their reference numerals, and a redundant description thereof is omitted.

Referring to FIG. 1, Flow supply apparatus according to one embodiment of the present disclosure includes a rail R, a transport unit 110, a gas treatment unit 120, a first communication module 1271, a second communication module 1272, and a gas treatment auxiliary unit 140.

Herein, the gas treatment unit 120 includes a supply gas storage tank 121, a first valve module 122, a supply docking module 123, a recovery gas storage tank 124, a second valve module 125, and an exhaust docking module 126 (see FIG. 2).

The first valve module 122 includes a first-first valve 1221 and a first-second valve 1222. The second valve module 125 includes a second-first valve 1251 and a second-second valve 1252.

The gas treatment unit 120 includes the first valve module 122 and the second valve module 125. The first valve module 122 includes the first-first valve 1221 and the first-second valve 1222 (see FIG. 3).

Meanwhile, the second valve module 125 includes the second-first valve 1251 and the second-second valve 1252. The gas treatment auxiliary unit 140 includes a purge gas supply module 141 and a purge gas recovery module 142 (see FIG. 3).

In addition, the supply docking module 123 includes a first base part 1231, a first interlocking part 1233, and a first docking part 1235. The exhaust docking module 126 includes a second base part 1261, a second interlocking part 1263, and a second docking part 1265 (see FIG. 4).

The purge gas supply module 141 includes a supply tank 1411, a supply pipe part 1412, and a supply docking part 1413. The purge gas recovery module 142 includes a recovery tank 1421, a recovery pipe part 1422, and a recovery docking part 1423 (see FIG. 5).

Herein, the rail R is installed at a ceiling on a logistics transfer line. An object 130 is loaded on the transport unit 110 disposed on the rail R. The gas treatment unit 110 is provided on the transport unit 110 (see FIG. 6).

The gas treatment unit 110 performs purging on the object 130. The object 130 includes a FOUP with a substrate accommodated therein. Fume is removed from the substrate through the purging.

The supply gas storage tank 121 of the gas handing unit 120 is provided on the transport unit 110 and stores a purge gas for the purging (see FIG. 6). The recovery gas storage tank 124 of the gas treatment unit 120 is provided on the transport unit 110 (see FIGS. 2 and 6).

The recovery gas storage tank 124 is meant to recover the purge gas from the purged object 130. Furthermore, the supply docking module 123 of the gas treatment unit 120 is docked on the object 130 to supply the purge gas (see FIGS. 2 and 6).

The exhaust docking module 126 of the gas treatment unit 120 is docked on the object 130 to exhaust the purge gas from the inside of the object 130.

The first base part 1231 of the supply docking module 123 is provided on the transport unit 110. The first interlocking part 1233 of the supply docking module 123 is connected to the first base part 1231 through a first-first connector 1232 (see FIGS. 6 and 7).

Herein, the first docking part 1235 of the supply docking module 123 is installed with the first base part on the first interlocking part 1233 through a first-second connector 1234 and docked on the object 130 (see FIGS. 6 and 7).

The first docking part 1235 rotates from the first base part 1231 in a set range through the first interlocking part 1233. The first docking part 1235 is rotatably provided on at least an area facing the object 130 (see FIGS. 6 and 7).

In that case, the first docking unit 1235 supplies the purge gas to the object 130 based on contact at least on a bottom surface of the object 130. The second base part 1261 of the exhaust docking module 126 is provided on the transport unit 110 in a predetermined shape (see FIGS. 6 and 7).

The second interlocking part 1263 of the exhaust docking module 126 is connected to the second base part 1261 through a second-first connector 1262. The second docking part 1265 of the exhaust docking module 126 is installed with the second base part 1261 on the second interlocking part 1263 through a second-second connector 1264 (see FIGS. 6 and 7).

Furthermore, the second docking part 1265 of the exhaust docking module 126 is docked on the object 130. The second docking part 1265 rotates from the second base part 1261 in a set range through the second interlocking part 1263 (see FIGS. 6 and 7).

The second docking part 1265 of the exhaust docking module 126 is rotatably provided on at least the area facing the object 130. The second docking part 1265 exhausts the purge gas from the object 130 based on contact at least on the bottom surface of the object 130 (see FIGS. 6 and 7).

The first valve module 122 of the gas treatment unit 120 controls the internal purge gas stream of the supply gas storage tank 121. The first-first valve 1221 of the first valve module 122 is meant to control one purge gas stream.

The first-second valve 1222 of the first valve module 122 controls the other purge gas stream. The first-first valve 1221 is disposed between the supply gas storage tank 121 and the supply docking module 123 (see FIGS. 3 and 6).

Herein, the second valve module 125 of the gas treatment unit 120 is meant to control the internal purge gas stream of the recovery gas storage tank. The second-first valve 1251 of the second valve module 125 is meant to control one purge gas stream (see FIGS. 3 and 6).

The second-second valve 1252 of the second valve module 125 is meant to control the other purge gas stream. The second-first valve 1251 is disposed between the recovery gas storage tank 124 and the exhaust docking module 126 (see FIGS. 3 and 6).

The gas treatment auxiliary unit 140 is docked with the gas treatment unit 120 to assist in treating the purge gas. The purge gas supply module 141 of the gas treatment auxiliary unit 140 is disposed on the rail R or the transport unit 110 and is mountable on or removable from that rail (see FIGS. 6 and 8).

The purge gas supply module 141 of the gas treatment auxiliary unit 140 supplies the purge gas to the supply gas storage tank 121. The purge gas recovery module 142 of the gas treatment auxiliary unit 140 is disposed on the rail R or the transport unit 110 and is mountable on or removable from that rail (see FIGS. 6 and 8).

The purge gas recovery module 142 of the gas treatment auxiliary unit 140 collects the purge gas from the recovery gas storage tank 124. Furthermore, the supply tank 1411 of the purge gas supply module 141 supplies the purge gas to the supply gas storage tank 121. The supply pipe part 1412 of the purge gas supply module 141 is connected to the supply tank 1411 to supply the purge gas from the supply tank 1411 (see FIGS. 4 and 8 to 10).

The supply docking part 1413 of the purge gas supply module 141 communicates with the supply pipe part 1412 and is docked at the supply gas storage tank 121 to supply the purge gas. The recovery tank 1421 of the purge gas recovery module 142 is meant to recover the purge gas from the recovery gas storage tank 124 (see FIGS. 4 and 8 to 10).

Herein, the recovery pipe part 1422 of the purge gas recovery module 142 is connected to the recovery tank 1421 to recover the purge gas from the recovery tank 1421. The recovery docking part 1423 of the purge gas recovery module 142 communicates with the recovery pipe part 1422 and is docked at the recovery gas storage tank 124 to recover the purge gas (see FIGS.

The first communication module 1271 communicates with the supply gas storage tank 121 and the supply docking unit 1413, respectively, to supply the purge gas. The second communication module 1272 communicates with the recovery gas storage tank 124 and the recovery docking unit 1423, respectively, to recover the purge gas (see FIGS. 4 and 8 to 10).

Referring to FIG. 11 based on the aforementioned description, in a flow supply method (S100) according to one embodiment of the present disclosure, the object 130 is loaded on the transport unit 110 disposed on the rail R. The inside of the object 130 is purged by injecting the purge gas into the loaded object 130 by the gas treatment unit 120 provided in the transport unit 110.

The object 130 includes the FOUP with the substrate accommodated therein. Fume is removed from the substrate inside the object 130 through the purging.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

DESCRIPTION OF THE REFERENCE SYMBOLS

110: Transport Unit
1101: means of driving
120: Gas Treatment Unit
121: Supply Gas Storage Tank
122: First Valve Module
123: Supply Docking Module
124: Recovery Gas Storage Tank
125: Second Valve Module
126: Exhaust Docking Module
130: Object
140: Gas Treatment Auxiliary Unit
141: Purge Gas Supply Module
142: Purge Gas Recovery Module
R: Rail
W: Ceiling Structure
ST1: First Fixing Structure
ST2: Second Fixing Structure

What is claimed is:
1. A flow supply method, comprising:
loading an object on a transport unit on a rail; and
purging the inside of the object by injecting a purge gas into the loaded object by a gas treatment unit provided in the transport unit,
wherein the object may include a FOUP with a substrate accommodated therein, and fume is removed from the substrate through the purging,
wherein the gas treatment unit comprises a supply docking module docked on the object, configured to supply the purge gas, and comprising:
a first base part provided on the transport unit;
a first interlocking part connected to the first base part through a first-first connector; and a first docking part installed with the first base part on the first interlocking part through a first-second connector and docked on the object.

2. The flow supply method of claim 1, wherein the gas treatment unit comprises:
a supply gas storage tank provided on the transport unit and configured to store the purge gas for the purging; and
a recovery gas storage tank provided on the transport unit and configured to recover the purge gas from the purged object.

3. The flow supply method of claim 2, wherein the gas treatment unit comprises:
an exhaust docking module docked on the object and configured to exhaust the purge gas from the inside of the object.

4. The flow supply method of claim 1, wherein the first docking part rotates from the first base part in a set range through the first interlocking part and is rotatably provided on at least an area facing the object.

5. The flow supply method of claim 1, wherein the first docking part supplies the purge gas to the object based on contact at least on a bottom surface of the object.

6. The flow supply method of claim 3, wherein the exhaust docking module comprises:
a second base part provided on the transport unit;
a second interlocking part connected to the second base part with a second-first connector; and
a second docking part installed with the second base part on the second interlocking part through a second-second connector.

7. The flow supply method of claim 6, wherein the second docking part rotates from the second base part in a set range through the second interlocking part and is rotatably provided on at least an area facing the object.

8. The flow supply method of claim 6, wherein the second docking part exhausts the purge gas from the object based on contact at least on a bottom surface of the object.

9. The flow supply method of claim 3, wherein the gas treatment unit comprises:
a first valve module configured to control an internal purge gas stream of the supply gas storage tank.

10. The flow supply method of claim 9, wherein the first valve module comprises:
a first-first valve configured to control one purge gas stream; and
a first-second valve configured to control the other purge gas stream,
wherein the first-first valve is disposed between the supply gas storage tank and the supply docking module.

11. The flow supply method of claim 3, wherein the gas treatment unit comprises:
a second valve module configured to control the internal purge gas stream of the recovery gas storage tank.

12. The flow supply method of claim 11, wherein the second valve module comprises:
a second-first valve configured to control one purge gas stream; and
a second-second valve configured to control another purge gas stream,
wherein the second-first valve is disposed between the recovery gas storage tank and the exhaust docking module.

13. The flow supply method of claim 3, comprising: a gas treatment auxiliary unit docked with the gas treatment unit to assist in treating the purge gas,
wherein the gas treatment auxiliary unit comprises:

a purge gas supply module disposed on the rail or the transport unit and configured to supply the purge gas to the supply gas storage tank; and
a purge gas recovery module disposed on the rail or the transport unit and configured to recover the purge gas from the recovery gas storage tank.

14. A flow supply apparatus, comprising:
a rail;
a transport unit disposed on the rail, where an object is loaded; and
a gas treatment unit provided on the transport unit and configured to purge the object,
wherein the object includes a FOUP with a substrate accommodated therein, and fume is removed from the substrate through the purging,
wherein the gas treatment unit comprises a supply docking module docked on the object, configured to supply the purge gas, and comprising:
a first base part provided on the transport unit;
a first interlocking part connected to the first base part through a first-first connector; and
a first docking part installed with the first base part on the first interlocking part through a first-second connector and docked on the object.

15. A flow supply apparatus, comprising:
a rail;
a transport unit disposed on the rail, where an object is loaded;
a gas treatment unit provided on the transport unit and configured to purge the object; and
a gas treatment auxiliary unit docked with the gas treatment unit to assist in treating a purge gas,
wherein the object includes a FOUP with a substrate accommodated therein, and fume is removed from the substrate through the purging, and
the gas treatment unit comprises:
a supply gas storage tank provided on the transport unit and configured to store the purge gas for the purging;
a recovery gas storage tank provided on the transport unit and configured to recover the purge gas from the purged object;
a supply docking module docked on the object and configured to supply the purge gas; and
an exhaust docking module docked on the object and configured to exhaust the purge gas from the inside of the object,
wherein the supply docking module comprises:
a first base part provided on the transport unit;
a first interlocking part connected to the first base part through a first-first connector; and
a first docking part installed with the first base part on a first connection part through a first-second connector and docked on the object;
wherein the first docking part rotates from the first base part in a set range through the first interlocking part, and is rotatably provided on an area facing at least the object, and the first docking part supplies the purge gas to the object based on contact at least on a bottom surface of the object,
wherein the gas treatment auxiliary unit comprises:
a purge gas supply module disposed on the rail or the transport unit and configured to supply the purge gas to the supply gas storage tank; and
a purge gas recovery module disposed on the rail or the transport unit and configured to recover the purge gas from the recovery gas storage tank.

* * * * *